(12) United States Patent
Narasimha et al.

(10) Patent No.: US 7,993,990 B2
(45) Date of Patent: Aug. 9, 2011

(54) MULTIPLE CRYSTALLOGRAPHIC ORIENTATION SEMICONDUCTOR STRUCTURES

(75) Inventors: Shreesh Narasimha, Beacon, NY (US); Paul David Agnello, Wappingers Falls, NY (US); Xiaomeng Chen, Poughkeepsie, NY (US); Judson R. Holt, Wappingers Falls, NY (US); Mukesh Vijay Khare, White Plains, NY (US); Byeong Y. Kim, Lagrangeville, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/757,567

(22) Filed: Apr. 9, 2010

(65) Prior Publication Data
US 2010/0197118 A1 Aug. 5, 2010

Related U.S. Application Data

(62) Division of application No. 11/931,209, filed on Oct. 31, 2007, now Pat. No. 7,696,573.

(51) Int. Cl.
*H01L 21/336* (2006.01)
(52) U.S. Cl. . 438/150; 438/154; 438/413; 257/E21.564; 257/E27.112; 257/E29.004; 257/E29.107
(58) Field of Classification Search ............ 438/187, 438/413, 150, 151, 154, 168, 198; 257/350, 257/627, E27.112, E29.004, E29.107, E21.131, 257/E21.564
See application file for complete search history.

(56) References Cited

U.S. PATENT DOCUMENTS

| | | | |
|---|---|---|---|
| 4,507,158 A * | 3/1985 | Kamins et al. | 438/413 |
| 4,619,033 A * | 10/1986 | Jastrzebski | 438/226 |
| 5,185,286 A * | 2/1993 | Eguchi | 438/400 |
| 5,344,785 A | 9/1994 | Jerome et al. | |
| 6,368,972 B1 | 4/2002 | Maury et al. | |
| 6,972,478 B1 | 12/2005 | Waite et al. | |
| 7,141,457 B2 | 11/2006 | Ieong et al. | |
| 7,208,815 B2 | 4/2007 | Chen et al. | |
| 7,364,958 B2 | 4/2008 | Ieong et al. | |
| 7,439,108 B2 | 10/2008 | Hsu et al. | |
| 7,494,918 B2 | 2/2009 | Kim et al. | |
| 7,498,216 B2 | 3/2009 | Nowak | |
| 7,531,392 B2 | 5/2009 | Ellis-Monaghan et al. | |
| 7,803,690 B2 * | 9/2010 | Yu et al. | 438/413 |
| 2005/0116290 A1 | 6/2005 | de Souza et al. | |
| 2006/0145264 A1 | 7/2006 | Chidambarrao et al. | |
| 2006/0148154 A1 | 7/2006 | Shin et al. | |

(Continued)

*Primary Examiner* — Toniae M Thomas
(74) *Attorney, Agent, or Firm* — Scully, Scott, Murphy & Presser, P.C.; Joseph P. Abate, Esq.

(57) ABSTRACT

A semiconductor structure includes an epitaxial surface semiconductor layer having a first dopant polarity and a first crystallographic orientation, and a laterally adjacent semiconductor-on-insulator surface semiconductor layer having a different second dopant polarity and different second crystallographic orientation. The epitaxial surface semiconductor layer has a first edge that has a defect and an adjoining second edge absent a defect. Located within the epitaxial surface semiconductor layer is a first device having a first gate perpendicular to the first edge and a second device having a second gate perpendicular to the second edge. The first device may include a performance sensitive logic device and the second device may include a yield sensitive memory device. An additional semiconductor structure includes a further laterally adjacent second semiconductor-on-insulator surface semiconductor layer having the first polarity and the second crystallographic orientation, and absent edge defects, to accommodate yield sensitive devices.

12 Claims, 5 Drawing Sheets

U.S. PATENT DOCUMENTS

| | | |
|---|---|---|
| 2007/0170507 A1 | 7/2007 | Zhu et al. |
| 2007/0187670 A1 | 8/2007 | Hsu et al. |
| 2007/0205460 A1 | 9/2007 | Chidambarrao |
| 2007/0218659 A1 * | 9/2007 | Spencer et al. ............ 438/497 |
| 2008/0203484 A1 | 8/2008 | Hofmann et al. |
| 2008/0242014 A1 | 10/2008 | Peidous |
| 2008/0268587 A1 | 10/2008 | Sadaka et al. |
| 2008/0274595 A1 | 11/2008 | Spencer et al. |
| 2009/0179269 A1 | 7/2009 | Hook et al. |

* cited by examiner

MULTIPLE CRYSTALLOGRAPHIC ORIENTATION SEMICONDUCTOR STRUCTURES

CROSS REFERENCE TO RELATED APPLICATION

This application is a divisional of U.S. Patent application Ser. No. 11/931,209, filed Oct. 31, 2007, now U.S. Pat. No. 7,696,573, the entire content and disclosure of which is incorporated herein by reference.

BACKGROUND

1. Field of the Invention

The invention relates generally to semiconductor structures including field effect transistors. More particularly, the invention relates to semiconductor structures including field effect transistors with enhanced performance.

2. Description of the Related Art

Semiconductor structures, which include resistors, transistors, diodes and capacitors, have been successfully scaled to increasingly smaller dimensions over a period of several decades. The scaling of semiconductor structures over several decades has provided both an enhanced functionality of semiconductor circuits, such as logic circuits, and an enhanced capacity of semiconductor products, such as, memory products.

In order to continue to provide increases in semiconductor circuit performance, a recent trend in semiconductor technology has been the fabrication of semiconductor devices, and in particular field effect devices, upon semiconductor substrates having multiple crystallographic orientation regions. By using semiconductor substrates having multiple crystallographic orientation regions, charge carrier mobilities may often be enhanced within the context of particular differing crystallographic orientation region polarities.

Semiconductor substrates having different crystallographic orientation regions do provide a clear charge carrier mobility advantage with respect to fabrication thereon of semiconductor devices having different polarities. However, the fabrication of semiconductor structures that incorporate different crystallographic orientation semiconductor substrate regions is not entirely without problems. In particular, fabricating semiconductor structures within semiconductor substrates that include multiple crystallographic orientation regions is difficult insofar as fabricating the multiple crystallographic orientation regions may not be readily accomplished absent defects therein.

Semiconductor substrates having multiple crystallographic orientation regions, and methods for fabrication thereof, are known in the semiconductor fabrication art.

For example, de Souza et al., in U.S. Patent Pub. No. 2005/0116290, teaches a particular method for fabricating a semiconductor substrate with multiple crystallographic orientation regions. The method utilizes an amorphization of a particular semiconductor layer within a semiconductor structure, and a recrystallization of the particular semiconductor layer with a different crystallographic orientation while using a template layer as a base layer for the recrystallization.

Semiconductor structure and device dimensions are certain to continue to decrease, and as a result thereof semiconductor devices and structures having enhanced performance at decreased dimensions are desirable. Particularly desirable are semiconductor structures that include multiple crystallographic orientation regions that provide enhanced semiconductor device performance.

SUMMARY OF THE INVENTION

The invention provides semiconductor structures, and methods for fabricating the semiconductor structures. The semiconductor structures include multiple crystallographic orientation semiconductor regions that include gate electrodes for field effect devices. The gate electrodes are disposed within the context of individual crystallographic orientation regions to accommodate comparatively high performance field effect devices (that may be edge defect density insensitive) and comparatively high density field effect devices (that may be edge defect density sensitive).

A semiconductor structure in accordance with the invention includes a substrate comprising an epitaxial surface semiconductor layer having a first polarity and a first crystallographic orientation, and a laterally adjacent semiconductor-on-insulator surface semiconductor layer having a second polarity and a second crystallographic orientation different than the first polarity and the first crystallographic orientation. The epitaxial surface semiconductor layer further includes a defect along a first edge but not along a second edge adjoining the first edge. The semiconductor structure also includes a first field effect device having a first gate perpendicular to the first edge. The semiconductor structure also includes a second field effect device having a second gate perpendicular to the second edge.

Another semiconductor structure in accordance with the invention includes an epitaxial surface semiconductor layer having a first dopant polarity and a first crystallographic orientation, and a laterally adjacent semiconductor-on-insulator surface semiconductor layer having a second dopant polarity and a second crystallographic orientation different than the first polarity and the first crystallographic orientation. This other semiconductor structure also includes a further laterally adjacent second semiconductor-on-insulator surface semiconductor layer having the first polarity and the second crystallographic orientation.

A method for fabricating a semiconductor structure in accordance with the invention includes forming over a semiconductor substrate, and laterally adjacent a semiconductor-on-insulator surface semiconductor layer having a second polarity and a second crystallographic, an epitaxial surface semiconductor layer having a first polarity and a first crystallographic orientation different than the second polarity and the second crystallographic orientation. The epitaxial surface semiconductor layer has a first edge having a first defect and an adjoining second edge absent a defect. The method also includes forming within the epitaxial surface semiconductor layer a first field effect device having a first gate and a second field effect device having a second gate. The first gate is perpendicular to the first edge and the second gate is perpendicular to the second edge.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein.

DESCRIPTION OF THE PREFERRED EMBODIMENT

The invention, which includes semiconductor structures including multiple crystallographic orientation regions and methods for fabricating the semiconductor structures, is understood within the context of the description provided below. The description provided below is understood within the context of the drawings described above. Since the drawings are intended for illustrative purposes, the drawings are not necessarily drawn to scale.

FIG. 1 to FIG. 7 show a series of schematic cross-sectional and plan-view diagrams illustrating the results of progressive stages in fabricating a semiconductor structure in accordance with an embodiment of the invention. This embodiment of the invention comprises a first embodiment of the invention.

Figure 1:
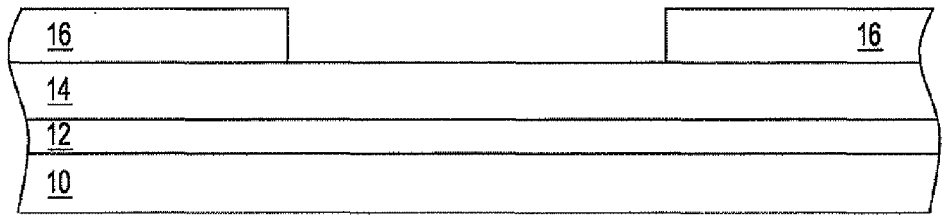
FIG. 1 to FIG. 7 show a series of schematic cross-sectional and plan-view diagrams illustrating the results of progressive stages in fabricating a semiconductor structure in accordance with an embodiment of the invention.

FIG. 1 shows a base semiconductor substrate 10 and a buried dielectric layer 12 located upon the base semiconductor substrate 10. A surface semiconductor layer 14 (i.e., a semiconductor-on-insulator surface semiconductor layer within the context of the claimed invention) is located upon the buried dielectric layer 12 and a hard mask layer 16 is located upon the surface semiconductor layer 14.

Each of the base semiconductor substrate 10 and the surface semiconductor layer 14 comprise a semiconductor material. Non-limiting examples of candidate semiconductor materials for the base semiconductor substrate 10 and the surface semiconductor layer 14 include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials. Generally, the base semiconductor substrate 10 and the surface semiconductor layer 14 may comprise the same or different semiconductor materials with respect to each of chemical composition, crystallographic orientation, dopant polarity and dopant concentration. However, within the context of the instant embodiment, the base semiconductor substrate 10 and the surface semiconductor layer 14 will generally differ within the context of at least crystallographic orientation and dopant polarity.

Typically, the base semiconductor substrate 10 comprises a 110 crystallographic orientation p-silicon or silicon-germanium alloy semiconductor material that has a thickness from about 0.5 to about 1.5 millimeters. Typically, the surface semiconductor layer 14 comprises a 100 crystallographic orientation n-silicon or silicon-germanium alloy semiconductor material that has a thickness from about 100 to about 2000 angstroms. However, neither the embodiment nor the invention is not limited to the foregoing selections for dopant polarity and crystallographic orientation of the base semiconductor substrate 10 and the surface semiconductor layer 14.

Within the context of the instant embodiment and the invention as claimed, the base semiconductor substrate 10 will be defined within the context of a first dopant polarity and a first crystallographic orientation. Similarly, within the context of the instant embodiment and the invention as claimed, the surface semiconductor layer 14 (or at least a portion thereof) will be defined within the context of a second dopant polarity and a second crystallographic orientation different from the first dopant polarity and the first crystallographic orientation.

The buried dielectric layer 12 may comprise any of several dielectric materials. Non-limiting examples of dielectric materials include oxides, nitrides and oxynitrides of silicon. Oxides, nitrides and oxynitrides of other elements are not excluded. Also not excluded are laminates of any of the foregoing dielectric materials. The buried dielectric layer 12 may comprise either a crystalline or a non-crystalline dielectric material.

The buried dielectric layer 12 may also be formed using any of several methods. Non-limiting examples include ion implantation induced oxidation or nitridation methods, thermal or plasma induced oxidation or nitridation methods, chemical vapor deposition methods and physical vapor deposition methods. Typically, the buried dielectric layer 12 comprises at least one of a silicon oxide material and a silicon nitride material that has a thickness from about 500 to about 2000 angstroms.

As is understood by a person skilled in the art, the base semiconductor substrate 10, the buried dielectric layer 12 and the surface semiconductor layer 14 in an aggregate comprise a semiconductor-on-insulator substrate. The semiconductor-on-insulator substrate may be formed using methods including but not limited to layer transfer methods, laminating methods and separation by implantation of oxygen (SIMOX) methods that are conventional in the semiconductor fabrication art.

The hard mask layer 16 comprises a hard mask material. Similarly with the dielectric materials from which is comprised the buried dielectric layer 12, suitable hard mask materials include oxides, nitrides and oxynitrides of silicon. Oxides nitrides and oxynitrides of other elements alternatively are also not excluded. The hard mask materials may in general be formed using the same or similar types of methods that are used for forming the buried dielectric layer 12. Typically, the hard mask layer 16 comprises a silicon oxide or (more preferably) a silicon nitride hard mask material that has a thickness from about 500 to about 1500 angstroms. In the alternative of the hard mask layer 16, the embodiment may also use a functionally equivalent mask layer comprising another alternative mask material, such as but not limited to a photoresist mask material.

Figure 2:
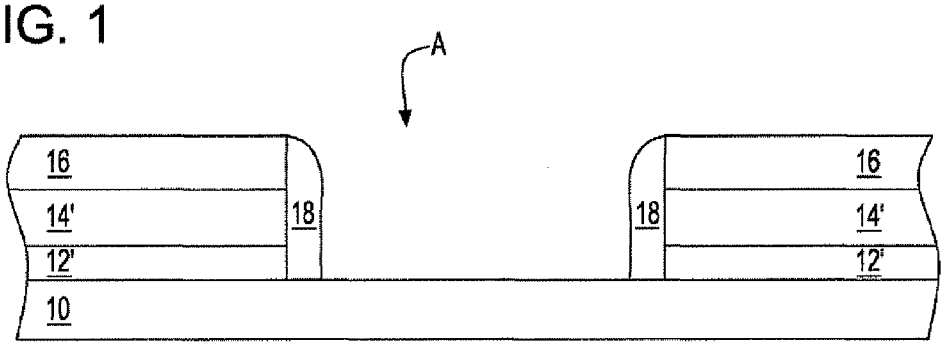

FIG. 2 shows the results of etching the surface semiconductor layer 14 and the buried dielectric layer 12 while using the base semiconductor substrate 10 as an etch stop layer and the hard mask layer 16 as an etch mask layer. The foregoing etching of the surface semiconductor layer 14 and the buried dielectric layer 12 provides a surface semiconductor layer 14' and a buried dielectric layer 12'. The etching is typically undertaken using a plasma etch method, although under certain circumstances a wet chemical etch method may also be used. Plasma etch methods are generally preferred insofar as plasma etch methods provide straight or nearly straight sidewalls to the surface semiconductor layer 14' and the buried dielectric layer 12'. Typically, the plasma etch method uses a chlorine containing etchant gas composition for etching a silicon containing semiconductor material and a fluorine containing etchant gas composition for etching a silicon containing dielectric material.

FIG. 2 also shows a spacer layer 18 (illustrated as plural layers in cross-section, but as will be illustrated in further detail below intended as a single annular layer in plan-view) adjoining and passivating sidewalls of the buried dielectric layer 12' and the surface semiconductor layer 14'. The spacer layer 18 defines an aperture A.

The spacer layer 18 is formed using a blanket layer deposition and anisotropic etchback method that is otherwise generally conventional in the semiconductor fabrication art. Typically the hard mask layer 16 and the spacer layer 18 comprise different dielectric materials. For example, when the hard mask layer 16 preferably comprises a silicon nitride material, the spacer layer 18 preferably comprises a silicon oxide material. Alternate materials choices may also be used for the hard mask layer 16 and the spacer layer 18.

Figure 3:
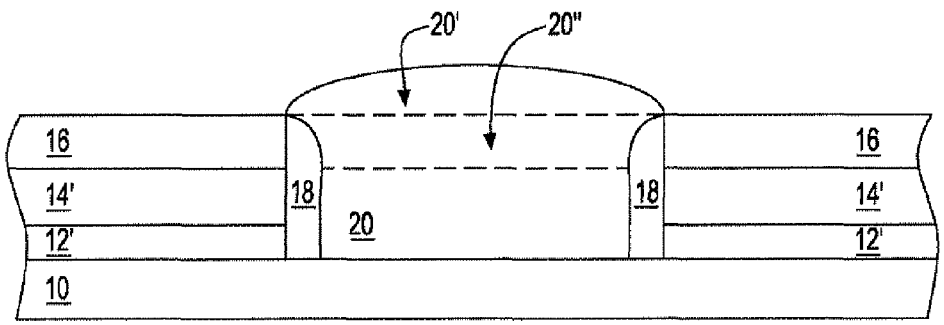

FIG. 3 shows the results of epitaxially growing an epitaxial surface semiconductor layer 20 from the base semiconductor substrate 10. The epitaxial surface semiconductor layer 20 overfills the aperture A that is illustrated in FIG. 2. The epitaxial surface semiconductor layer 20 thus replicates a crystallographic orientation of the base semiconductor substrate 10 into the epitaxial surface semiconductor layer 20. The epitaxial method that is used for forming the epitaxial surface semiconductor layer 20 is typically an epitaxial chemical vapor deposition method that uses appropriate silicon and/or germanium source materials.

FIG. 3 also shows a first dashed line that corresponds with reference numeral 20'. The first dashed line that corresponds with reference numeral 20' corresponds with the location and dimensions of a planarized epitaxial surface semiconductor layer that is formed from the epitaxial surface semiconductor layer 20. FIG. 3 finally shows a second dashed line that corresponds with reference numeral 20". The second dashed line that corresponds with reference numeral 20" corresponds with the location and dimensions of a planarized and etched back epitaxial surface semiconductor layer that is formed from the planarized epitaxial surface semiconductor layer.

Figure 4:
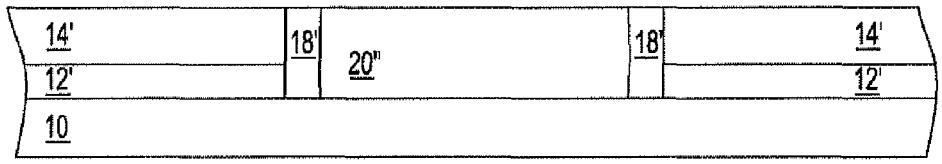

FIG. 4 first shows the results of planarizing the epitaxial surface semiconductor layer to the dashed line that corresponds with reference numeral 20' within FIG. 3. The planarizing forms a planarized epitaxial surface semiconductor layer that is not specifically illustrated within FIG. 4. FIG. 4 also shows the results of etching back the foregoing planarized epitaxial surface semiconductor layer to the dashed line that corresponds with reference numeral 20" within FIG. 3. The etching back forms the planarized and etched back epitaxial surface semiconductor layer 20" from the planarized epitaxial surface semiconductor layer.

The planarizing of the epitaxial surface semiconductor layer 20 to provide the planarized epitaxial surface semiconductor layer whose dimensions correspond with reference numeral 20' in FIG. 3 may be effected using planarizing methods that are conventional in the semiconductor fabrication art. Non-limiting examples of such planarizing methods include mechanical planarizing methods and chemical-mechanical polish planarizing methods. Chemical-mechanical polish planarizing methods are more common. The etching back of the planarized epitaxial surface semiconductor layer whose dimensions correspond with reference numeral 20' to provide the planarized and etched back epitaxial surface semiconductor layer whose dimensions correspond with reference numeral 20" may be undertaken using wet chemical etchback methods and materials or dry plasma etchback methods and materials. Wet chemical etchback methods and materials typically use aqueous acid solutions. Dry plasma etchback methods and materials typically use chlorine containing etchant gas compositions.

FIG. 4 also shows the results of stripping the hard mask layer 16 from the surface semiconductor layer 14'. The hard mask layer 16 may be stripped using methods and materials that are conventional in the semiconductor fabrication art. Non-limiting examples include wet chemical stripping methods, dry plasma stripping methods and aggregate stripping methods thereof. For exemplary purposes, and while not limiting the embodiment or the invention, when the hard mask layer 16 comprises a silicon nitride material, wet chemical stripping methods may commonly use an aqueous phosphoric acid solution at an elevated temperature. Under such circumstances, functionally equivalent dry plasma etch methods may commonly use a fluorine containing etchant gas composition.

FIG. 4 finally shows the results of planarizing the spacer layer 18 to form a spacer layer 18', while using the surface semiconductor layer 14' and the epitaxial surface semiconductor layer 20" as a planarizing stop layer. Similarly with the planarizing of the epitaxial surface semiconductor layer 20 to provide the planarized epitaxial surface semiconductor layer whose dimensions correspond with reference numeral 20' as illustrated in FIG. 3, non-limiting examples of planarizing methods include purely mechanical planarizing methods and chemical mechanical polish planarizing methods. Again, chemical mechanical polish planarizing methods are more common.

Figure 5:
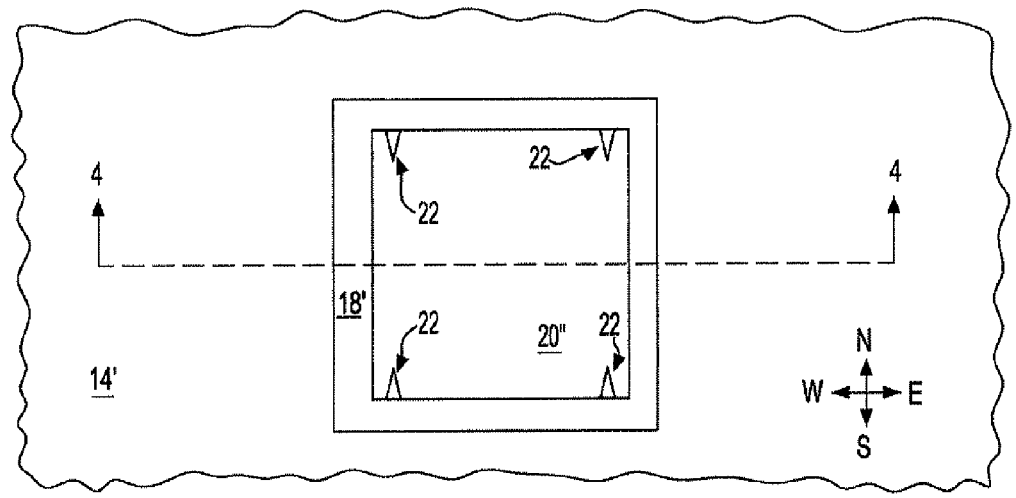

FIG. 5 shows a schematic plan-view diagram corresponding with the schematic cross-sectional diagram of FIG. 4.

FIG. 5 shows the surface semiconductor layer 14' that is separated from the epitaxial surface semiconductor layer 20" by the spacer layer 18'. FIG. 5 also illustrates a plurality of edge defects 22 that is formed at a pair of opposite edges of the epitaxial surface semiconductor layer 20" but not an adjoining and perpendicular pair of opposite edges of the epitaxial surface semiconductor layer 20".

Within the instant embodiment, and as disclosed above, the epitaxial surface semiconductor layer 20" preferably has a p-dopant polarity and a 110 crystallographic orientation. In addition, the surface semiconductor layer 14' preferably has an n-dopant polarity and a 100 crystallographic orientation. Within the schematic plan-view diagram of FIG. 5, when the epitaxial surface semiconductor layer 20" comprises the 110 crystallographic orientation, a north-south axis in the plane of the epitaxial surface semiconductor layer 20" comprises a <100> current flow direction having a comparatively reduced hole charge carrier mobility. Similarly, an east-west axis in the plane of the epitaxial surface semiconductor layer 20" comprises a <110> current flow direction having a comparatively enhanced hole charge carrier mobility.

Figure 6:
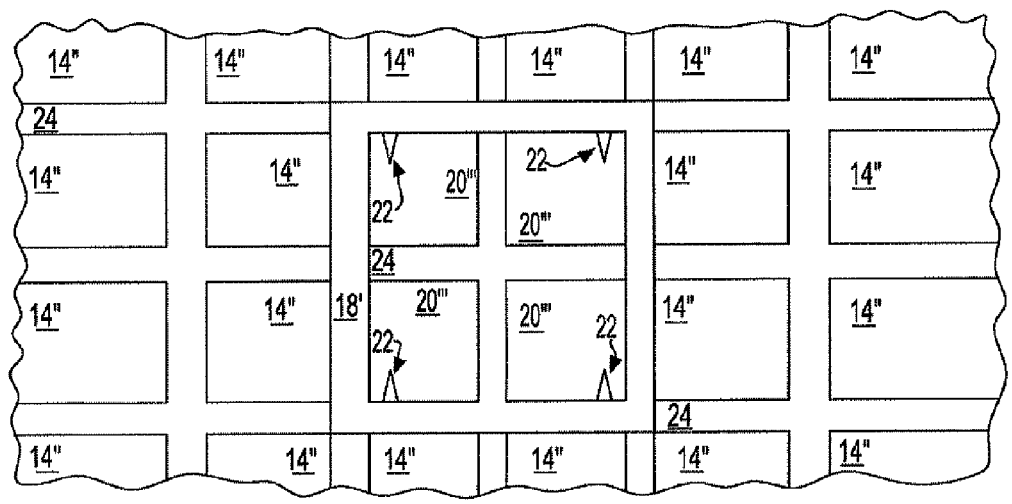

FIG. 6 shows a schematic plan-view diagram illustrating the results of further processing of the semiconductor structure of FIG. 5.

FIG. 6 shows the addition of isolation region grids 24 to the semiconductor structure of FIG. 5. The isolation region grids 24 provide surface semiconductor layer active regions 14" from the surface semiconductor layer 14' and epitaxial surface semiconductor layer active regions 20'" from the epitaxial surface semiconductor layer 20". The isolation region grids 24 may be formed using methods that are conventional in the semiconductor fabrication art. The methods typically provide for a trench patterning of the surface semiconductor layer 14' and the epitaxial surface semiconductor layer 20", followed by a blanket dielectric material layer deposition and planarizing of the blanket deposited dielectric material layer to form the isolation region grids 24. The deposition of the dielectric material may be undertaken using any of several methods. Non-limiting examples include chemical vapor deposition methods and physical vapor deposition methods. The planarizing may be effected using methods including but not limited to mechanical planarizing methods and chemical mechanical polish planarizing methods. Similarly with the spacer layer 18', the isolation region grids 24 may comprise dielectric materials including but not limited to oxides, nitrides and oxynitrides of silicon. Oxides, nitrides and oxynitrides of other elements are also not excluded.

Figure 7:
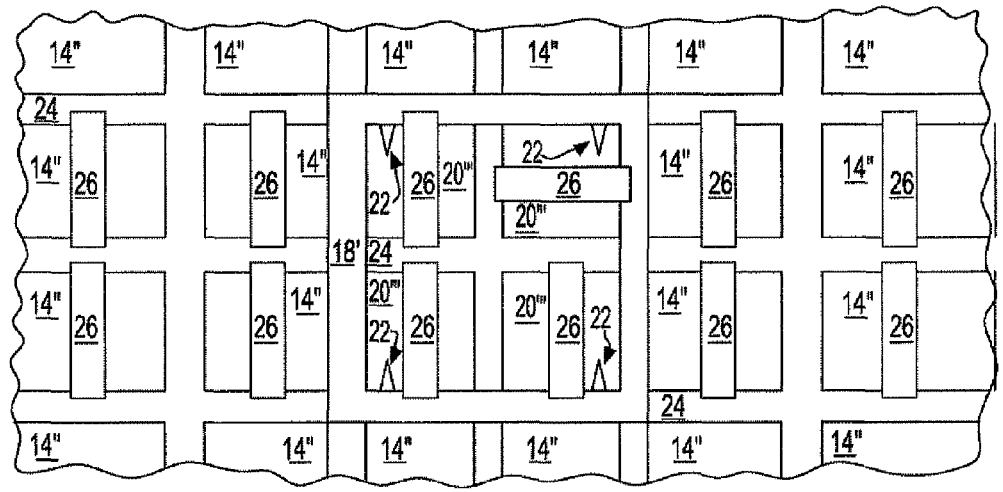

FIG. 7 shows the addition of gate electrodes 26 and 26' that span individual active regions including the epitaxial surface semiconductor layer active regions 20''' and the surface semiconductor layer active regions 14''. As is illustrated within the schematic plan-view diagram of FIG. 7, a plurality of gate electrodes 26 is arranged in a north-south direction, while a single gate electrode 26' is arranged in an east-west direction. More particularly, within the epitaxial surface semiconductor layer active regions 20''', a plurality of north-south arranged gate electrodes 26 bisect a plurality of the epitaxial surface semiconductor layer active regions 20''' at a plurality of edges thereof that include a plurality of defects 22. The east-west arranged gate electrode 26' bisects an epitaxial surface semiconductor layer active region 20''' at an edge thereof that does not include a defect 22.

Within the semiconductor structure of FIG. 7, the three gate electrodes 26 arranged north-south within the epitaxial surface semiconductor layer active regions 20''' are intended to be included within logic devices that may be designed and fabricated with sufficient semiconductor substrate surface area that allows for no particular compromise of logic device performance due to a proximity to a particular edge defect 22. Thus, the logic field effect devices may be designed and optimized for performance absent consideration of edge defects 22. In contrast, the gate electrode 26' arranged east-west within the epitaxial surface semiconductor layer active region 20''' is intended to be included within a memory device (i.e., such as a random access memory device) within a memory array where a proximity of the gate electrode 26' to an edge defect 22 influences memory device yield and/or reliability. Thus, in accordance with the foregoing disclosure, logic devices within the epitaxial surface semiconductor layer active regions 20''' are generally designed and fabricated for performance sensitivity while memory devices within the epitaxial surface semiconductor layer active regions 20''' are generally designed and fabricated for yield sensitivity.

Since none of the surface semiconductor layer active regions 14'' has an edge defect, gate electrodes 26 within field effect devices that use those surface semiconductor layer active regions 14'' as channels may all be aligned in a single direction for both memory devices and logic devices, in accordance with optimized electron charge carrier mobility.

FIG. 7 shows a schematic plan-view diagram of a semiconductor structure in accordance with an embodiment of the invention. The semiconductor structure comprises a hybrid orientation substrate that comprises a surface semiconductor layer 14' further divided into a plurality of surface semiconductor layer active regions 14''. The hybrid orientation substrate also comprises an epitaxial surface semiconductor layer 20'' further divided into a plurality of epitaxial surface semiconductor layer active regions 20'''. As is illustrated in FIG. 7, the epitaxial surface semiconductor layer active regions 20''' include a plurality of edge defects 22 that arise along a pair of opposite edges of the epitaxial surface semiconductor layer active regions 20''' but not along a pair of adjoining and opposite edges of the epitaxial surface semiconductor layer active regions 20'''. Within the instant embodiment, a field effect device comprising a gate electrode 26 or 26' is formed and located within each of the epitaxial surface semiconductor layer active regions 20'''. Within logic field effect devices for which performance is desirably optimized, a gate electrode 26 is aligned so that the gate electrode 26 bisects an edge of an epitaxial surface semiconductor layer active region 20''' that includes an edge defect 22 in order to derive full charge carrier mobility benefit from a desirable <100> crystallographic current flow orientation. Within memory field effect devices for which yield is desirable optimized, a gate electrode 26' is aligned with respect to an epitaxial surface semiconductor layer active region 20''' so that the gate electrode 26' bisects an edge that does not include an edge defect 22.

Although the instant embodiment discloses in general field effect devices that include gate electrodes as components thereof, the embodiment more specifically intends that the field effect devices include field effect transistors. As is understood by a person skilled in the art, the field effect transistors will typically also include gate dielectrics interposed between: (1) a gate electrode 26 or 26'; and (2) a surface semiconductor layer active region 14'' or an epitaxial surface semiconductor layer active region 20'''. In addition, the field effect transistors will typically also include source/drain regions within the surface semiconductor layer active regions 14'' and the epitaxial surface semiconductor layer active regions 20'''. The source/drain regions are separated by channel regions aligned beneath the gate electrodes 26 or 26'. The gate dielectrics and the source/drain regions may be formed using methods and materials that are conventional in the semiconductor fabrication art, although they are not specifically illustrated.

Beyond field effect transistors, the embodiment and the invention also contemplate applicability to other field effect devices. Included but not limiting are field effect capacitors (i.e., such as decoupling capacitors) and field effect diodes (i.e., such as gate bounded diodes).

FIG. 8 to FIG. 12 show a series of schematic cross-sectional and plan-view diagrams illustrating the results of progressive stages in fabricating a semiconductor structure in accordance with another embodiment of the invention. This other embodiment of the invention comprises a second embodiment of the invention.

This other embodiment includes hybrid orientation substrate processing analogous or identical to the hybrid orientation substrate processing that is illustrated in FIG. 1 to FIG. 4. Thus, within this other embodiment, FIG. 8 illustrates the results of further processing of the semiconductor structure of FIG. 4.

Figure 8:
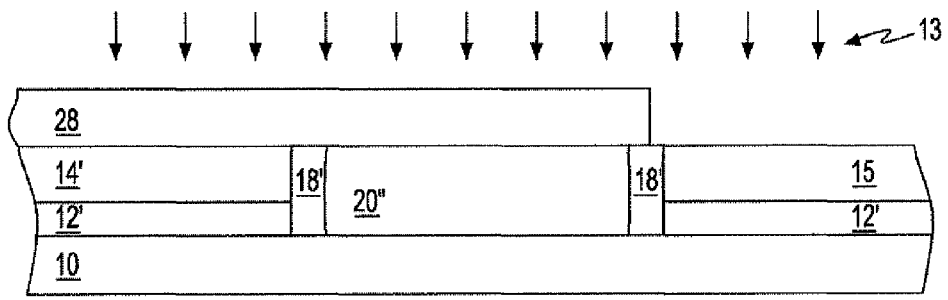
FIG. 8 to FIG. 12 show a series of schematic cross-sectional and plan-view diagrams illustrating the results of progressive stages in fabricating a semiconductor structure in accordance with another embodiment of the invention.

FIG. 8 illustrates a mask layer 28 located upon the semiconductor structure of FIG. 4. The mask layer 28 spans over a portion of the surface semiconductor layer 14' and all of the epitaxial surface semiconductor layer 20''. The mask layer 28 leaves exposed an other portion of the surface semiconductor layer 14'.

FIG. 8 also illustrates a dose of counterdoping ions 13 that is implanted into the exposed surface semiconductor layer 14' to provide a counterdoped surface semiconductor layer 15. The counterdoped surface semiconductor layer 15 has a dopant polarity that is: (1) opposite the remaining portion (i.e., the masked portion) of the surface semiconductor layer 14'; and (2) the same as the epitaxial surface semiconductor layer 20''. Typically, the counter dopant concentration is from about 1e11 to about 1e17 counter dopant atoms per cubic centimeter.

Within the second embodiment, the mask layer 28 may comprise any of several mask materials. Non-limiting examples include hard mask materials and photoresist mask materials. Non-limiting examples of photoresist mask materials include positive photoresist materials, negative photoresist materials and hybrid photoresist materials. Within the second embodiment, the mask layer 28 typically comprises a positive photoresist material or a negative photoresist material that has a thickness from about 500 to about 3500 angstroms.

Figure 9:
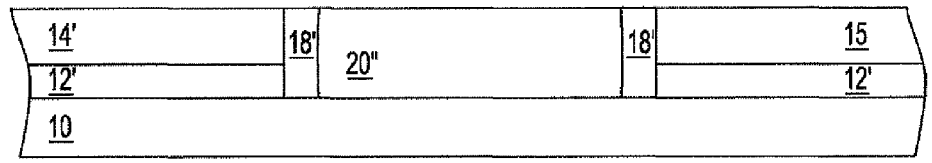

FIG. 9 shows the semiconductor structure of FIG. 8, but from which has been stripped the mask layer 28. The mask layer 28 may be stripped using methods and materials that are conventional in the semiconductor fabrication art and appropriate to the materials of composition of the mask layer 28. Included but not limiting are wet chemical stripping methods, dry plasma stripping methods and aggregate stripping methods thereof.

Figure 10:
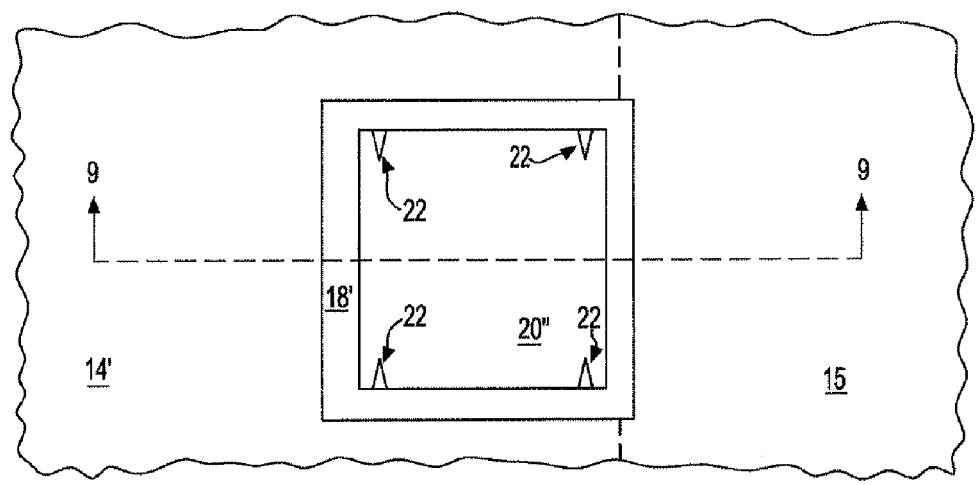

FIG. 10 is a schematic plan-view diagram that corresponds with the schematic cross-sectional diagram of FIG. 9. FIG. 10 also corresponds with the schematic plan-view diagram of FIG. 5, but with the exception of the counterdoped surface semiconductor layer 15 in place of a portion of the surface semiconductor layer 14'.

Figure 11:
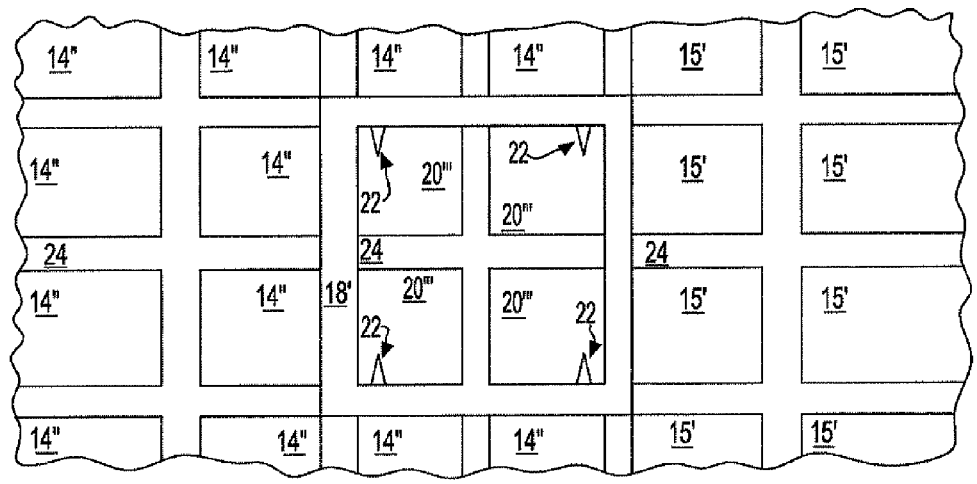

FIG. 11 similarly also corresponds with FIG. 6, but with the counterdoped semiconductor surface layer active regions 15' in place of a quantity of the surface semiconductor layer active regions 14".

Figure 12:
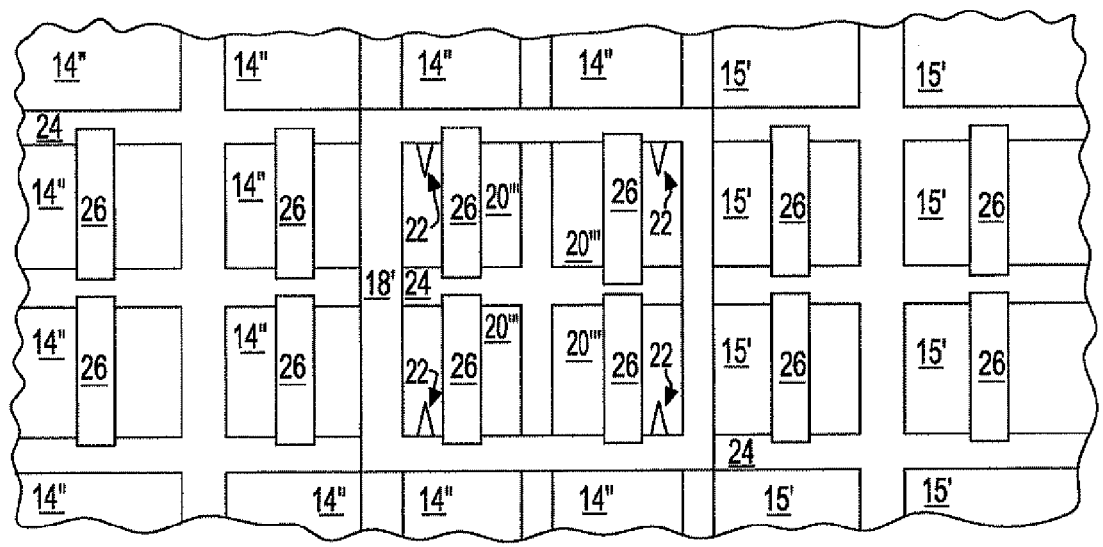

FIG. 12 corresponds with FIG. 7, but with all gate electrodes 26 within the surface semiconductor layer active regions 14", the counterdoped surface semiconductor layer active regions 15' and the epitaxial surface semiconductor layer active regions 20''' being aligned in the same north-south direction. Within the context of the epitaxial surface semiconductor layer active regions 20''' the gate electrodes 26 bisect the edges of the spitaxial surface semiconductor layer active regions 20''' that include the edge defects 22.

Within this other embodiment, all field effect devices within the epitaxial surface semiconductor layer active regions 20''' are intended as logic devices which may be designed and fabricated so that logic device performance is not compromised due to the presence of the edge defects 22.

Within this other embodiment, the field effect devices within the counterdoped surface semiconductor layer active regions 15' are intended as memory devices that are designed and fabricated so that edge defect sensitivity would impair memory device yield. However, since the memory devices are fabricated within semiconductor-on-insulator surface semiconductor layer active regions 15' (i.e., absent edge defects) rather than epitaxial surface semiconductor layer active region 20''' (i.e., comprising edge defects), the memory device yields are not compromised.

The preferred embodiments of the invention are illustrative of the invention rather than limiting of the invention. Revisions and modifications may be made to methods, materials, structures and dimensions of semiconductor structures in accordance with the preferred embodiments of the invention while still providing semiconductor structures in accordance with the invention, further in accordance with the accompanying claims.

What is claimed is:

1. A method for fabricating a semiconductor structure comprising:
   providing a semiconductor-on-insulator substrate including a base semiconductor layer having a first crystallographic orientation, a buried dielectric layer located on an upper surface of the base semiconductor layer, and a semiconductor-on-insulator surface semiconductor layer having a second crystallographic orientation located on an upper surface of said buried dielectric layer, wherein said second crystallographic orientation is different from said first crystallographic orientation;
   forming a patterned hard mask having at least one opening on an upper surface of said semiconductor-on-insulator surface semiconductor layer;
   etching exposed portions of the semiconductor-on-insulator surface semiconductor layer and the buried dielectric layer within said at least one opening and not protected by the patterned hard mask, stopping atop the upper surface of the base semiconductor layer;
   forming a spacer within the at least one opening, wherein a base of the spacer is located on an exposed surface of said base semiconductor layer and a vertical wall of said spacer is located on exposed wall portions of at least the etched semiconductor-on-insulator surface semiconductor layer and the etched buried dielectric layer;
   forming an epitaxial surface semiconductor layer having the first crystallographic orientation on remaining exposed surfaces of the base semiconductor layer, atop said spacer and atop said patterned hard mask;
   removing portions of the epitaxial surface semiconductor layer, portions of the spacer and the patterned hard mask to provide a planarized substrate having said semiconductor-on-insulator surface semiconductor layer of said second crystallographic orientation separated from the epitaxial surface semiconductor layer by remaining portions of the spacer, wherein the epitaxial surface semiconductor layer has a first edge having a first defect and an adjoining second edge absent a defect; and
   forming within the epitaxial surface semiconductor layer a first field effect device having a first gate and a second field effect device having a second gate, the first gate being perpendicular to the first edge and the second gate being perpendicular to the second edge.

2. The method of claim 1 wherein the first edge is perpendicular to the second edge.

3. The method of claim 1 wherein said base semiconductor layer and said epitaxial surface semiconductor layer have a first polarity, and wherein said semiconductor-on-insulator surface semiconductor layer has a second polarity that differs from said first polarity.

4. The method of claim 3 wherein the first polarity is a p-polarity and the first crystallographic orientation is a 110 crystallographic orientation.

5. The method of claim 3 wherein the second polarity is an n-polarity and the second crystallographic orientation is a 100 crystallographic orientation.

6. The method of claim 1 wherein the etching exposed portions of the semiconductor-on-insulator surface semiconductor layer and the buried dielectric layer within said at least one opening includes plasma etching.

7. The method of claim 1 wherein said forming the spacer includes deposition of a spacer material and etching.

8. The method of claim 1 wherein said forming an epitaxial surface semiconductor layer comprises epitaxial growth of a semiconductor material from said exposed surface of the base semiconductor layer.

9. The method of claim 8 wherein said semiconductor material includes silicon and germanium.

10. The method of claim 1 wherein said removing portions of the epitaxial surface semiconductor layer, portions of the spacer and the patterned hard mask includes first planarizing the epitaxial surface semiconductor layer to a first height which is substantially coplanar with an upper surface of the patterned hard mask; etching back the planarized epitaxial surface semiconductor layer having said first height to a second height that is substantially coplanar with the upper surface of the semiconductor-on-insulator surface semiconductor layer; stripping the patterned hard mask; and planarizing the spacer.

11. the method of claim 1 further comprising introducing a counterdopant ion into an exposed surface of the semiconductor-on-insulator surface semiconductor layer prior to forming the first and second field effect devices.

12. The method of claim 1 wherein each of the first field effect device and the second field effect device comprises a field effect transistor.

* * * * *